(12) United States Patent
Boyacioglu et al.

(10) Patent No.: US 10,859,653 B2
(45) Date of Patent: Dec. 8, 2020

(54) BLIND SOURCE SEPARATION IN MAGNETIC RESONANCE FINGERPRINTING

(71) Applicant: Case Western Reserve University, Cleveland, OH (US)

(72) Inventors: Rasim Boyacioglu, Cleveland Heights, OH (US); Debra McGivney, Bay Village, OH (US); Mark A. Griswold, Shaker Heights, OH (US)

(73) Assignee: CASE WESTERN RESERVE UNIVERSITY, Cleveland, OH (US)

( * ) Notice: Subject to any disclaimer, the term of this patent is extended or adjusted under 35 U.S.C. 154(b) by 160 days.

(21) Appl. No.: 16/169,694

(22) Filed: Oct. 24, 2018

(65) Prior Publication Data

US 2019/0120921 A1   Apr. 25, 2019

Related U.S. Application Data

(60) Provisional application No. 62/576,598, filed on Oct. 24, 2017.

(51) Int. Cl.
| | |
|---|---|
| *G01R 33/56* | (2006.01) |
| *G01R 33/50* | (2006.01) |
| *G01R 33/48* | (2006.01) |
| *G01R 33/54* | (2006.01) |

(52) U.S. Cl.
CPC ......... *G01R 33/56* (2013.01); *G01R 33/4828* (2013.01); *G01R 33/50* (2013.01); *G01R 33/543* (2013.01); *G01R 33/5602* (2013.01)

(58) Field of Classification Search
CPC .... G01R 33/56; G01R 33/4828; G01R 33/50; G01R 33/543; G01R 33/5602; G01R 33/5608; G01R 33/3415; G01R 33/283; G01R 33/307; G01R 33/60; G01V 3/32; E21B 49/08; E21B 2049/085; G01N 24/10

See application file for complete search history.

(56) References Cited

U.S. PATENT DOCUMENTS

| | | | |
|---|---|---|---|
| 8,723,518 B2 | 5/2014 | Seiberlich | |
| 2009/0001262 A1* | 1/2009 | Visser | G06K 9/6242 250/282 |
| 2009/0222262 A1* | 9/2009 | Kim | G10L 21/0272 704/231 |
| 2015/0297101 A1* | 10/2015 | Hernandez-Garcia | A61B 5/0263 600/419 |
| 2015/0301141 A1 | 10/2015 | Griswold | |

(Continued)

OTHER PUBLICATIONS

Ma D., et al., in "Magnetic Resonance Fingerprinting," Nature, 2013; 495(7440):187-192.

(Continued)

*Primary Examiner* — Patrick Assouad
*Assistant Examiner* — Taqi R Nasir
(74) *Attorney, Agent, or Firm* — Quarles & Brady LLP

(57) ABSTRACT

Systems and methods are provided for Magnetic Resonance Fingerprinting (MRF) using Independent Component Analysis (ICA) to distinguish between different tissue types. In some configurations, an MRF acquisition may be performed to be sensitive to a selected tissue property or parameter, and tissues may be grouped into separate independent components based on their time courses which may be based on the underlying tissue property.

29 Claims, 5 Drawing Sheets

(56) References Cited

U.S. PATENT DOCUMENTS

| | | | | |
|---|---|---|---|---|
| 2015/0346300 A1* | 12/2015 | Setsompop | ........ | G01R 33/4828 |
| | | | | 324/309 |
| 2016/0029120 A1* | 1/2016 | Nesta | .................... | H04M 9/082 |
| | | | | 381/66 |
| 2016/0282430 A1* | 9/2016 | Gulani | ............... | G01R 33/4828 |
| 2017/0234951 A1* | 8/2017 | Zhao | ...................... | G01R 33/50 |
| | | | | 324/309 |
| 2017/0328973 A1* | 11/2017 | Amthor | .............. | G01R 33/5608 |

OTHER PUBLICATIONS

Hyvarinen A. "Fast and Robust Fixed-Point Algorithms for Independent Component Analysis," IEEE Trans Neural Netw, 1999; 10(3):626-634.

Beckmann C.F. et al "Probabilistic Independent Component Analysis for Functional Magnetic Resonance Imaging," IEEE Trans Med Imaging , 2004; 23(2):137-152.

\* cited by examiner

BLIND SOURCE SEPARATION IN MAGNETIC RESONANCE FINGERPRINTING

CROSS-REFERENCE TO RELATED APPLICATIONS

This application claims the benefit of U.S. Provisional Patent Application Ser. No. 62/576,598 filed on Oct. 24, 2017 and entitled "Blind Source Separation in Magnetic Resonance Fingerprinting."

STATEMENT REGARDING FEDERALLY SPONSORED RESEARCH

N/A

BACKGROUND

If two tissues of interest (A and B) are known to have different properties and if there is interest in distinguishing tissues A and B, clinicians can try to design a pulse sequence for magnetic resonance imaging (MRI) to acquire two different datasets, where one is weighted for A and the other is weighted for B. If successful, the clinician can create images from the two datasets and try to qualitatively distinguish or separate tissue A from tissue B based on the spatial contrast difference.

To achieve this separation, the clinician can adjust the various components of the pulse sequence. However, the variables available are limited and insufficient differentiation makes the qualitative differentiation or separation difficult or impossible. For example, all traditional pulse sequences are composed of similar preparation phases, waiting phases, and acquisition phases that serially produce signals that form the datasets. The preparation phase determines when a signal can be acquired and determines the properties of the acquired signal. For example, a first pulse sequence may produce a T1-weighted signal at a first echo time (TE), while a second pulse sequence may produce a T2-weighted signal at a second TE. These conventional pulse sequences typically provide qualitative results where data are acquired with various weightings or contrasts that highlight a particular parameter (e.g., T1 relaxation, T2 relaxation).

When magnetic resonance ("MR") images are generated, they may be viewed by a radiologist and/or surgeon who interprets the qualitative images for specific disease signatures. The radiologist may examine multiple image types (e.g., T1-weighted, T2-weighted) acquired in multiple imaging planes to make a diagnosis. The radiologist or other individual examining the qualitative images may need particular skill to be able to assess changes from session to session, from machine to machine, and from machine configuration to machine configuration.

Unlike conventional MRI, magnetic resonance fingerprinting (MRF) employs a series of varied sequence blocks that simultaneously produce different signal evolutions in different resonant species (e.g., tissues) to which the radio frequency (RF) is applied. The signals from different resonant tissues will, however, be different and can be distinguished using MRF. Thus, using MRF, a clinician can design a pulse sequence that is certain to be sensitive to tissue A and tissue B, generate quantitative maps from the two datasets, and differentiate tissue A from tissue B based on the quantitative spatial maps. Characterizing tissue species using MRF can include quantifying different properties of a resonant species (e.g., T1 spin-lattice relaxation, T2 spin-spin relaxation, proton density). Other properties like tissue types and super-position of attributes can also be identified using MRF. Furthermore, these properties and others may be identified simultaneously using MRF, as further described, as one example, by D. Ma, et al., in "Magnetic Resonance Fingerprinting," Nature, 2013; 495 (7440): 187-192.

That is, using MRF the different signals evolutions from resonant species in a volume can be collected over a period of time. Resonant species in the volume can then be characterized by comparing the signal evolution to known evolutions. Characterizing the resonant species may include identifying a material or tissue type, or may include identifying MR parameters associated with the resonant species. The "known" evolutions may be, for example, simulated evolutions calculated from physical principles and/or previously acquired evolutions. A large set of known evolutions may be stored in a dictionary.

SUMMARY OF THE DISCLOSURE

The present disclosure provides systems and methods for improved analysis, quantification, and creation of MRF maps or images. In one non-limiting implementation, independent component analysis (ICA) can be used to process MRF datasets and improve the ability to distinguish between different tissue types. An MRF acquisition may be performed to be sensitive to a selected tissue property or parameter, and tissues may be grouped into separate independent components based on their time courses, which may be based on the underlying tissue property. Spatio-temporal separation of tissues into multiple components, rather than relying on spatial contrast differences, can yield improved accuracy in creating quantitative reports, such as MRF maps and/or images.

In one configuration, a method is provided for distinguishing a tissue in a subject using magnetic resonance fingerprinting (MRF). The method includes selecting at least one tissue property of interest and acquiring MRF data sensitive to the at least one tissue property of interest. An independent component analysis (ICA) may be performed on the MRF time course data to distinguish a tissue with the property of interest.

In one configuration, a system is provided for distinguishing a tissue in a subject using magnetic resonance fingerprinting (MRF). The system includes a computer system configured to: i) determine at least one tissue property of interest; ii) acquire MRF time course data sensitive to the at least one tissue property of interest; iii) perform an Independent Component Analysis (ICA) on the acquired time course data to distinguish the tissue in the subject.

In one configuration, a system is provided for distinguishing a tissue in a subject using magnetic resonance fingerprinting (MRF). The system includes a computer system configured to: i) acquire MRF time course data sensitive to a signal source; and ii) perform an Independent Component Analysis (ICA) on the acquired time course data to distinguish the tissue in the subject.

In one configuration, a method is provided for distinguishing a tissue in a subject using magnetic resonance fingerprinting (MRF). The method includes acquiring MRF data sensitive to at least one signal source. An independent component analysis (ICA) may be performed on the MRF time course data to distinguish a tissue with the signal source.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

DETAILED DESCRIPTION

Figure 1:
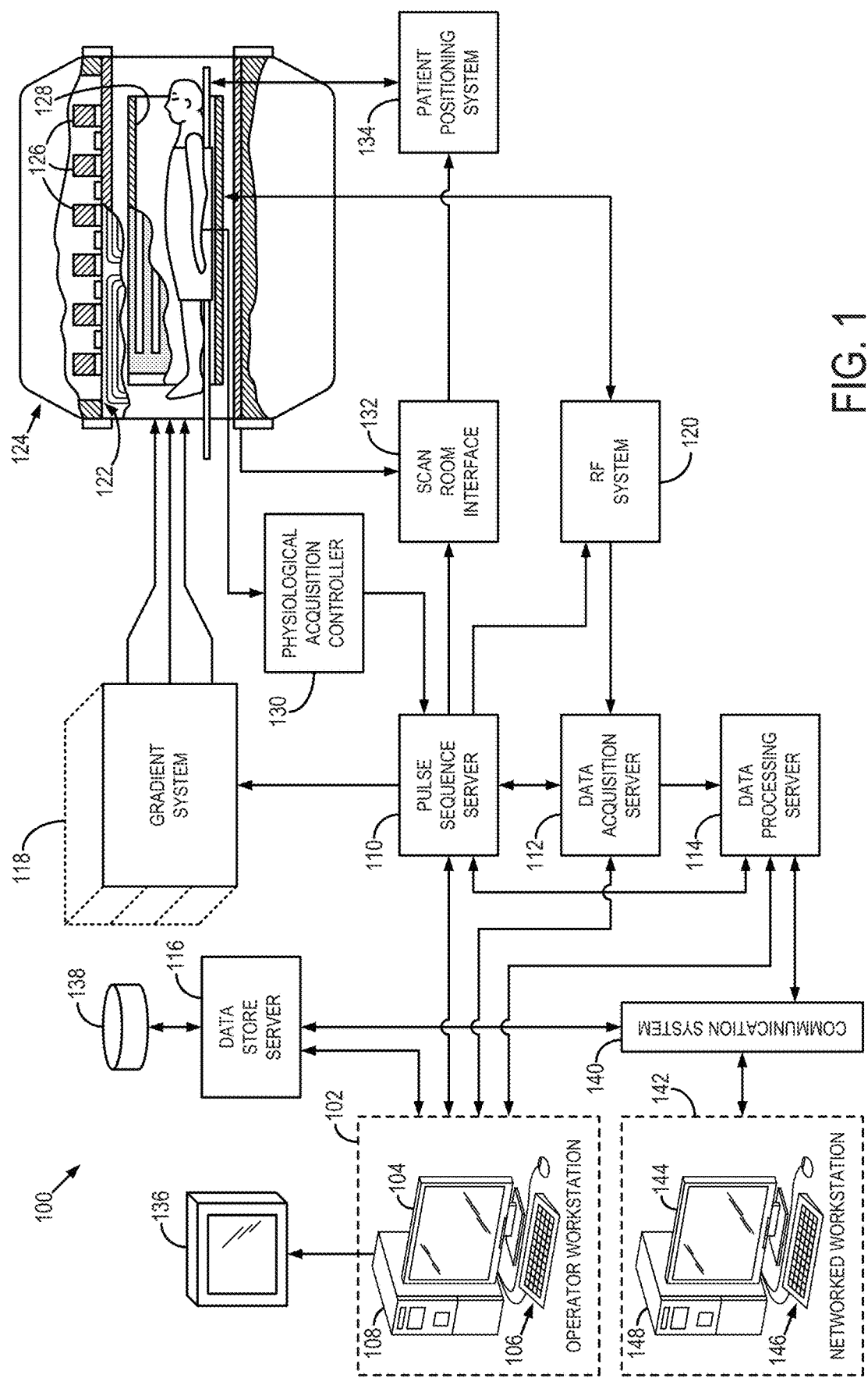
FIG. 1 is a block diagram of an example magnetic resonance imaging ("MRI") system configured with respect to systems and methods in accordance with the disclosure.

Magnetic resonance fingerprinting (MRF) is a technique that facilitates mapping of tissue or other material properties based on random or pseudorandom measurements of the subject or object being imaged. In particular, MRF can be conceptualized as employing a series of varied "sequence blocks" that simultaneously produce different signal evolutions in different "resonant species" to which the RF is applied. The term "resonant species," as used herein, refers to a material, such as water, fat, bone, muscle, soft tissue, and the like, that can be made to resonate using NMR. By way of illustration, when radio frequency (RF) energy is applied to a volume that has both bone and muscle tissue, then both the bone and muscle tissue will produce a nuclear magnetic resonance (NMR) signal; however, the "bone signal" represents a first resonant species and the "muscle signal" represents a second resonant species, and thus the two signals will be different. These different signals from different species can be collected simultaneously over a period of time to collect an overall "signal evolution" for the volume.

Data acquired with an MRF technique generally includes data containing random measurements, pseudorandom measurements, or measurements obtained in a manner that results in spatially incoherent signals, temporal incoherent signals, or spatiotemporally incoherent signals. For instance, such data can be acquired by varying acquisition parameters from one TR period to the next, which creates a time series of signals with varying contrast. Using this series of varied sequence blocks simultaneously produces different signal evolutions in different resonant species to which RF energy is applied.

More particularly, these signal evolutions obtained in MRF techniques are achieved by varying the acquisition parameters from one repetition time (TR) period to the next, which creates a time series of signals with varying contrast. Examples of acquisition parameters that can be varied include flip angle (FA), RF pulse phase, TR, echo time (TE), and sampling patterns, such as by modifying one or more readout encoding gradients. The acquisition parameters are varied in a random manner, pseudorandom manner, or other manner that results in signals from different materials or tissues to be spatially incoherent, temporally incoherent, or both. For example, in some instances, the acquisition parameters can be varied according to a non-random or non-pseudorandom pattern that otherwise results in signals from different materials or tissues to be spatially incoherent, temporally incoherent, or both.

The RF energy may be applied in a series of variable sequence blocks. Sequence blocks may vary in a number of parameters including, but not limited to, echo time, flip angle, phase encoding, diffusion encoding, flow encoding, RF pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, type of gradient applied between a readout portion of a sequence block and an excitation portion of a sequence block, number of gradients applied between a readout portion of a sequence block and an excitation portion of a sequence block, type of gradient applied during a readout portion of a sequence block, number of gradients applied during a readout portion of a sequence block, amount of RF spoiling, and amount of gradient spoiling. Depending upon the imaging or clinical need, two, three, four, or more parameters may vary between sequence blocks. The number of parameters varied between sequence blocks may itself vary. For example, a first sequence block may differ from a second sequence block in five parameters, the second sequence block may differ from a third sequence block in seven parameters, the third sequence block may differ from a fourth sequence block in two parameters, and so on. One skilled in the art will appreciate that there are a very-large number of series of sequence blocks that can be created by varying this large number of parameters. A series of sequence blocks can be crafted so that the series have different amounts (e.g., 1%, 2%, 5%, 10%, 50%, 99%, 100%) of unique sequence blocks as defined by their varied parameters. A series of sequence blocks may include more than ten, more than one hundred, more than one thousand, more than ten thousand, and more than one hundred thousand sequence blocks. In one example, the only difference between consecutive sequence blocks may be the number or parameters of excitation pulses.

Regardless of the particular imaging parameters that are varied or the number or type of sequence blocks, the RF energy applied during a sequence block is configured to cause different individual resonant species to simultaneously produce individual NMR signals. Unlike conventional imaging techniques, in an MRF pulse sequence, at least one member of the series of variable sequence blocks will differ from at least one other member of the series of variable sequence blocks in at least N sequence block parameters, where N is an integer greater than one. One skilled in the art will appreciate that the signal content of a signal evolution may vary directly with N. Thus, as more parameters are varied, a potentially richer signal is retrieved. Conventionally, a signal that depends on a single parameter is desired and required to facilitate imaging. Here, acquiring signals with greater information content facilitates producing more distinct, and thus more unique, signal evolutions.

The pulse sequence used to acquire the provided data may apply members of the series of variable sequence blocks according to a partially random or pseudorandom acquisition plan configured to undersample the object at an undersampling rate, R. In different situations, the undersampling rate, R, may be, for example, two, four, or greater.

Unlike conventional MRI imaging processes, where the time during which an imaging-relevant NMR signal can be acquired is severely limited (e.g., 4-5 seconds), the NMR apparatus can be controlled to acquire NMR signal for significantly longer periods of time. For example, the NMR apparatus can be controlled to acquire signal for up to ten seconds, for up to twenty seconds, for up to one hundred seconds, or longer. NMR signals can be acquired for longer periods of time because signal information content remains viable for longer periods of time in response to the series of varied RF energy applied. In different situations, the information content in the signal evolution may remain above an information content threshold for at least five seconds, for at least ten seconds, for at least sixty seconds, or for longer. An information content threshold may describe, for example, the degree to which a subsequent signal acquisition includes information that can be retrieved and that differs from information acquired in a previous signal acquisition. For example, a signal that has no retrievable information would likely fall below an information content threshold while a signal with retrievable information that differs from information retrieved from a previous signal would likely be above the information content threshold.

From these signal evolutions, which as mentioned above may be random or pseudorandom, or may contain signals from different materials or tissues that are spatially incoherent, temporally incoherent, or both, MRF processes can be designed to map any of a wide variety of parameters. Examples of such parameters that can be mapped may include, but are not limited to, longitudinal relaxation time ($T_1$), transverse relaxation time ($T_2$), main or static magnetic field map ($B_0$), and proton density ($\rho$). MRF is generally described in U.S. Pat. No. 8,723,518 and Published U.S. Patent Application No. 2015/0301141, each of which is incorporated herein by reference in its entirety.

The data acquired with MRF techniques are compared with a dictionary of signal models, or templates, that have been generated for different acquisition parameters from magnetic resonance signal models, such as Bloch equation-based physics simulations. This comparison allows estimation of the physical parameters, such as those mentioned above. As an example, the comparison of the acquired signals to a dictionary can be performed using any suitable matching or pattern recognition technique. The parameters for the tissue or other material in a given voxel are estimated to be the values that provide the best signal template matching. For instance, the comparison of the acquired data with the dictionary can result in the selection of a signal vector, which may constitute a weighted combination of signal vectors, from the dictionary that best corresponds to the observed signal evolution. The selected signal vector includes values for multiple different quantitative parameters, which can be extracted from the selected signal vector and used to generate the relevant quantitative parameter maps.

The stored signals and information derived from reference signal evolutions may be associated with a potentially very large data space. The data space for signal evolutions can be partially described by:

$$SE = \sum_{s=1}^{N_S} \prod_{i=1}^{N_A} \sum_{j=1}^{N_{RF}} R_i(\alpha) R_{RF_{ij}}(\alpha, \phi) R(G) E_i(T_1, T_2, D) M_0; \quad (1)$$

where SE is a signal evolution; $N_S$ is a number of spins; $N_A$ is a number of sequence blocks; N is a number of RF pulses in a sequence block; $\alpha$ is a flip angle; $\phi$ is a phase angle; $R_i(\alpha)$ is a rotation due to off resonance; $R_{RF_{ij}}(\alpha,\phi)$ is a rotation due to RF differences; $R(G)$ is a rotation due to a magnetic field gradient; $T_1$ is a longitudinal, or spin-lattice, relaxation time; $T_2$ is a transverse, or spin-spin, relaxation time; D is diffusion relaxation; $E_i(T_1,T_2,D)$ is a signal decay due to relaxation differences; and $M_0$ is the magnetization in the default or natural alignment to which spins align when placed in the main magnetic field.

While $E_i(T_1,T_2,D)$ is provided as an example, in different situations, the decay term, $E_i(T_1,T_2,D)$, may also include additional terms, $E_i(T_1,T_2,D, \ldots)$ or may include fewer terms, such as by not including the diffusion relaxation, as $E_i(T_1, T_2)$ or $E_i(T_1,T_2, \ldots)$. Also, the summation on "j" could be replace by a product on "j".

The dictionary may store signals described by, $$S_i = R_i E_i(S_{i-1}) \quad (2);$$

where $S_0$ is the default, or equilibrium, magnetization; $S_i$ is a vector that represents the different components of magnetization, $M_x$, $M_y$, and $M_z$ during the $i^{th}$ acquisition block; $R_i$ is a combination of rotational effects that occur during the $i^{th}$ acquisition block; and $E_i$ is a combination of effects that alter the amount of magnetization in the different states for the $i^{th}$ acquisition block. In this situation, the signal at the $i^{th}$ acquisition block is a function of the previous signal at acquisition block (i.e., the $(i-1)^{th}$ acquisition block). Additionally or alternatively, the dictionary may store signals as a function of the current relaxation and rotation effects and of previous acquisitions. Additionally or alternatively, the dictionary may store signals such that voxels have multiple resonant species or spins, and the effects may be different for every spin within a voxel. Further still, the dictionary may store signals such that voxels may have multiple resonant species or spins, and the effects may be different for spins within a voxel, and thus the signal may be a function of the effects and the previous acquisition blocks.

Systems and methods are provided for magnetic resonance fingerprinting (MRF) using independent component analysis (ICA) to distinguish between different tissue types. In some configurations, an MRF acquisition may be performed to be sensitive to a selected tissue property or parameter, and tissues may be grouped into separate independent components based on their time courses which may be based on the underlying tissue property.

As described, an MRF pulse sequence manipulates MR signals to form signal evolutions that vary, such as with variable flip angles and repetition times. The signal evolutions are functions of the underlying tissue properties, such as T1 and T2 relaxation times as well as other system parameters. During reconstruction, each voxel's signal evolution is matched to a dictionary entry of known information. For example, the dictionary may be simulated with Bloch equations for possible tissue properties and known system parameters. Unlike conventional imaging, the MRF allows for quantitative identification of tissue intra-subject (at different times), inter-subject, and with multiple cohort studies, even at multiple institutions.

In some configurations, systems and methods in accordance with the present disclosure may remove the need for matching signal evolution values for a particular tissue. In other words, the systems and methods of the present disclosure may remove dependence on a simulated dictionary. A simulated dictionary may include previously stored MRF signal evolutions identifying a tissue. For MRF dictionary matching, it is known that any tissue property or system parameter deviation not accounted for in the dictionary might affect tissue property maps which in return might complicate characterization of differences between tissues.

As will be described, the present disclosure provides an MRF framework for using ICA to distinguish between different tissue types. In accordance with the systems and methods of the present disclosure, ICA can be utilized to perform a blind source separation technique. An MRF acquisition may be performed to be sensitive to a selected tissue property or parameter, and tissues may be grouped into separate independent components based on their time courses which will be based on the underlying tissue property. Spatio-temporal separation of tissues into multiple components rather than relying solely on spatial contrast differences can substantially improve the reconstruction process and the ultimate reports, maps, or images generated from the MRF data.

Referring particularly now to FIG. 1, an example of an MRI system 100 that can implement the methods described here is illustrated. The MRI system 100 includes an operator workstation 102 that may include a display 104, one or more input devices 106 (e.g., a keyboard, a mouse), and a processor 108. The processor 108 may include a commercially available programmable machine running a commercially available operating system. The operator workstation 102 provides an operator interface that facilitates entering scan parameters into the MRI system 100. The operator workstation 102 may be coupled to different servers, including, for example, a pulse sequence server 110, a data acquisition server 112, a data processing server 114, and a data store server 116. The operator workstation 102 and the servers 110, 112, 114, and 116 may be connected via a communication system 140, which may include wired or wireless network connections.

The pulse sequence server 110 functions in response to instructions provided by the operator workstation 102 to operate a gradient system 118 and a radiofrequency ("RF") system 120. Gradient waveforms for performing a prescribed scan are produced and applied to the gradient system 118, which then excites gradient coils in an assembly 122 to produce the magnetic field gradients $G_x$, $G_y$, and $G_z$ that are used for spatially encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil to perform the prescribed magnetic resonance pulse sequence. Responsive magnetic resonance signals detected by the RF coil 128, or a separate local coil, are received by the RF system 120. The responsive magnetic resonance signals may be amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the prescribed scan and direction from the pulse sequence server 110 to produce RF pulses of the desired frequency, phase, and pulse amplitude waveform. The generated RF pulses may be applied to the whole-body RF coil 128 or to one or more local coils or coil arrays.

The RF system 120 also includes one or more RF receiver channels. An RF receiver channel includes an RF preamplifier that amplifies the magnetic resonance signal received by the coil 128 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \qquad (3);$$

and the phase of the received magnetic resonance signal may also be determined according to the following relationship:

$$\varphi = \tan^{-1}\left(\frac{Q}{I}\right). \qquad (4)$$

The pulse sequence server 110 may receive patient data from a physiological acquisition controller 130. By way of example, the physiological acquisition controller 130 may receive signals from a number of different sensors connected to the patient, including electrocardiograph ("ECG") signals from electrodes, or respiratory signals from a respiratory bellows or other respiratory monitoring devices. These signals may be used by the pulse sequence server 110 to synchronize, or "gate," the performance of the scan with the subject's heart beat or respiration.

The pulse sequence server 110 may also connect to a scan room interface circuit 132 that receives signals from various sensors associated with the condition of the patient and the magnet system. Through the scan room interface circuit 132, a patient positioning system 134 can receive commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, so that data is not lost by data overrun. In some scans, the data acquisition server 112 passes the acquired magnetic resonance data to the data processor server 114. In scans that require information derived from acquired magnetic resonance data to control the further performance of the scan, the data acquisition server 112 may be programmed to produce such information and convey it to the pulse sequence server 110. For example, during pre-scans, magnetic resonance data may be acquired and used to calibrate the pulse sequence performed by the pulse sequence server 110. As another example, navigator signals may be acquired and used to adjust the operating parameters of the RF system 120 or the gradient system 118, or to control the view order in which k-space is sampled. In still another example, the data acquisition server 112 may also process magnetic resonance signals used to detect the arrival of a contrast agent in a magnetic resonance angiography ("MRA") scan. For example, the data acquisition server 112 may acquire magnetic resonance data and processes it in real-time to produce information that is used to control the scan.

The data processing server 114 receives magnetic resonance data from the data acquisition server 112 and processes the magnetic resonance data in accordance with instructions provided by the operator workstation 102. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 114 are conveyed back to the operator workstation 102 for storage. Real-time images may be stored in a data base memory cache, from which they may be output to operator display 102 or a display 136. Batch mode images or selected real time images may be stored in a host database on disc storage 138. When such images have been reconstructed and transferred to storage, the data processing server 114 may notify the data store server 116 on the operator workstation 102. The operator workstation 102 may be used by an operator to archive the images, produce films, or send the images via a network to other facilities.

The MRI system 100 may also include one or more networked workstations 142. For example, a networked workstation 142 may include a display 144, one or more input devices 146 (e.g., a keyboard, a mouse), and a processor 148. The networked workstation 142 may be located within the same facility as the operator workstation 102, or in a different facility, such as a different healthcare institution or clinic.

The networked workstation 142 may gain remote access to the data processing server 114 or data store server 116 via the communication system 140. Accordingly, multiple networked workstations 142 may have access to the data processing server 114 and the data store server 116. In this manner, magnetic resonance data, reconstructed images, or other data may be exchanged between the data processing server 114 or the data store server 116 and the networked workstations 142, such that the data or images may be remotely processed by a networked workstation 142.

Figure 2:
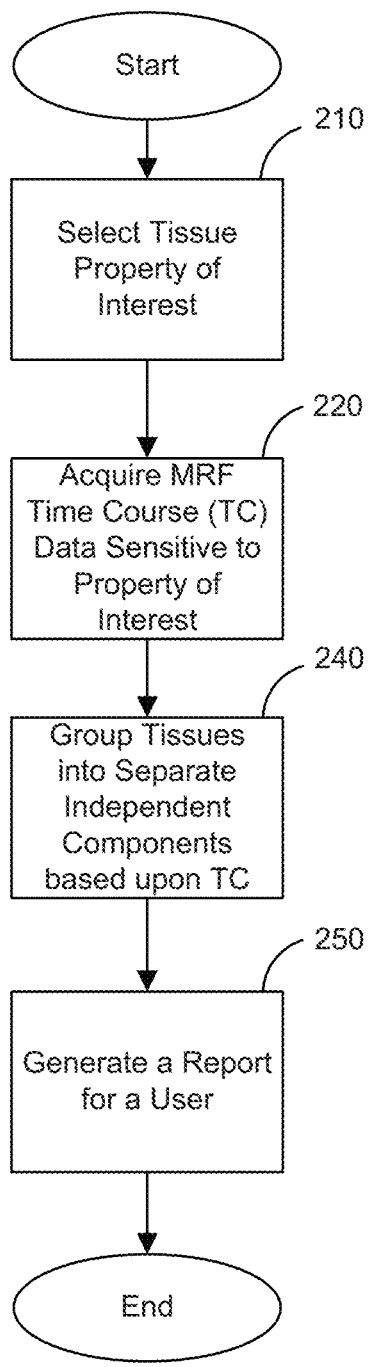
FIG. 2 is a flow chart setting forth some non-limiting examples of steps for a method in accordance with the present disclosure.

Referring to FIG. 2, a flow chart sets forth some non-limiting examples of steps for a method in accordance with the present disclosure. One or more property of interest for a tissue may be selected or determined at step 210. Some non-limiting examples of properties of interest may include tissue composition, material, or longitudinal relaxation time ($T_1$), transverse relaxation time ($T_2$), main or static magnetic field map ($B_0$), and proton density ($\rho$), as stated above regarding MRF parameters. A tissue property of interest may also include features which spatially represent an unexpected source of bias or noise on MRF data. An MRF sequence that is sensitive to the selected tissue properties is performed at step 220 to acquire MRF time course data. An MRF sequence may be performed as described previously where RF energy may be applied in a series of variable sequence blocks to acquire MRF time course data. In some configurations, tissue properties cause the signal to have similar time course data for a given tissue.

In some configurations, the property of interest may not be known prior to acquiring the MRF data. Such non-targeted or non-selected signal sources may include an unexpected source of bias, artifact, or noise on MRF data. In such cases, the selection step 210 may be omitted and the MRF time course data acquired at step 220 may be acquired with a sequence that is sensitive across a wide range of tissues, materials, or properties.

At step 240, an independent component analysis may be performed on the time course datasets to group tissues into separate independent components. ICA may be performed using, but is not limited to, a probabilistic ICA technique, such as those disclosed by A. Hyvarinen in "Fast and Robust Fixed-Point Algorithms for Independent Component Analysis," *IEEE Trans Neural Netw*, 1999; 10(3):626-634. These references are herein incorporated by reference for all purposes. ICA may be performed to model at least two components (or at least three components, at least five components, or more components) from each MRF time course series datasets. In some configurations, performing an ICA analysis includes performing both a spatial and a temporal separation of the time course data.

In some configurations, MRF frames, including highly undersampled MRF frames, may be reconstructed. It is found experimentally that the cyclic aliasing artifacts contribute an important part of the variance of MRF data which can be removed with low rank MRF reconstruction. Then, 4D MRF data, after transformation into 2D (timexspace), may be fed into an ICA routine, which decomposes the data into multiple ICs. The components may correspond to different anatomical structures. In one non-limiting example case of a patient diagnosed with GBM, solid tumor and peri-tumoral white matter are assigned to different ICs.

A report may be generated for a user at step 250 and may include an identification of the tissue, a map of the tissue overlaid upon or integrated with a medical image of the region of interest, a colorized map of the tissue, or another form of indication of the tissue property of interest. The report may quantify the tissue properties.

Figure 3:
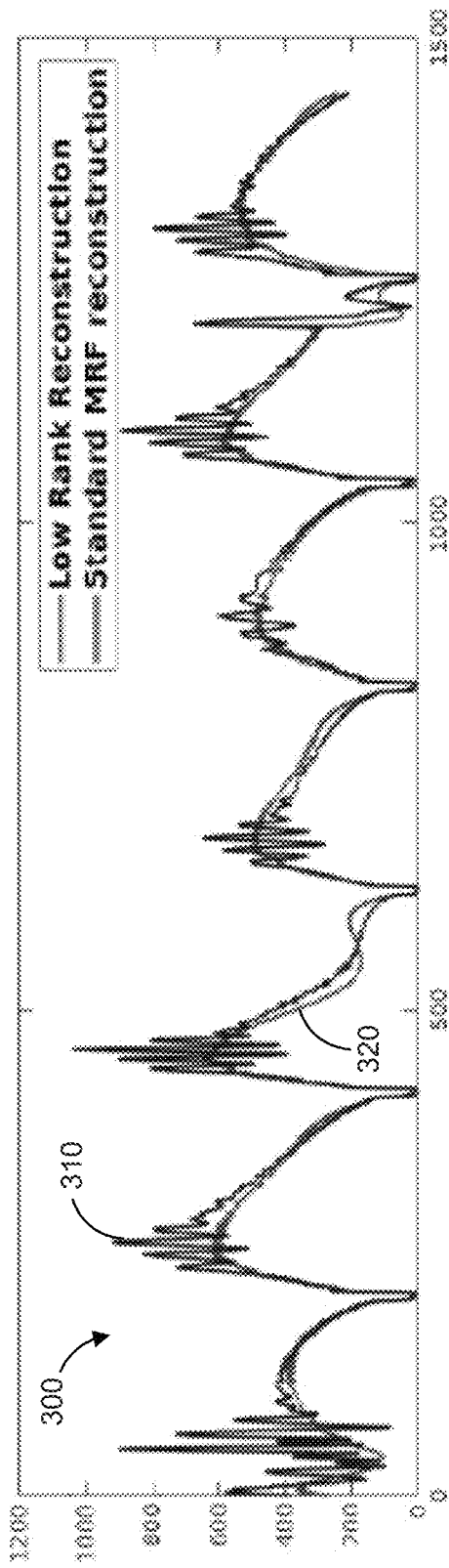
FIG. 3 is a graph of a non-limiting example MRF time course with standard and low rank reconstructions in accordance with the present disclosure.

Referring to FIG. 3, a graph of a non-limiting example MRF time course datasets 300 with standard reconstruction 310 and low-rank reconstruction 320 is shown in accordance with the present disclosure. A time course may be an MRF signal evolution monitored over a period of time. A low rank reconstruction routine may be used.

Figure 4:
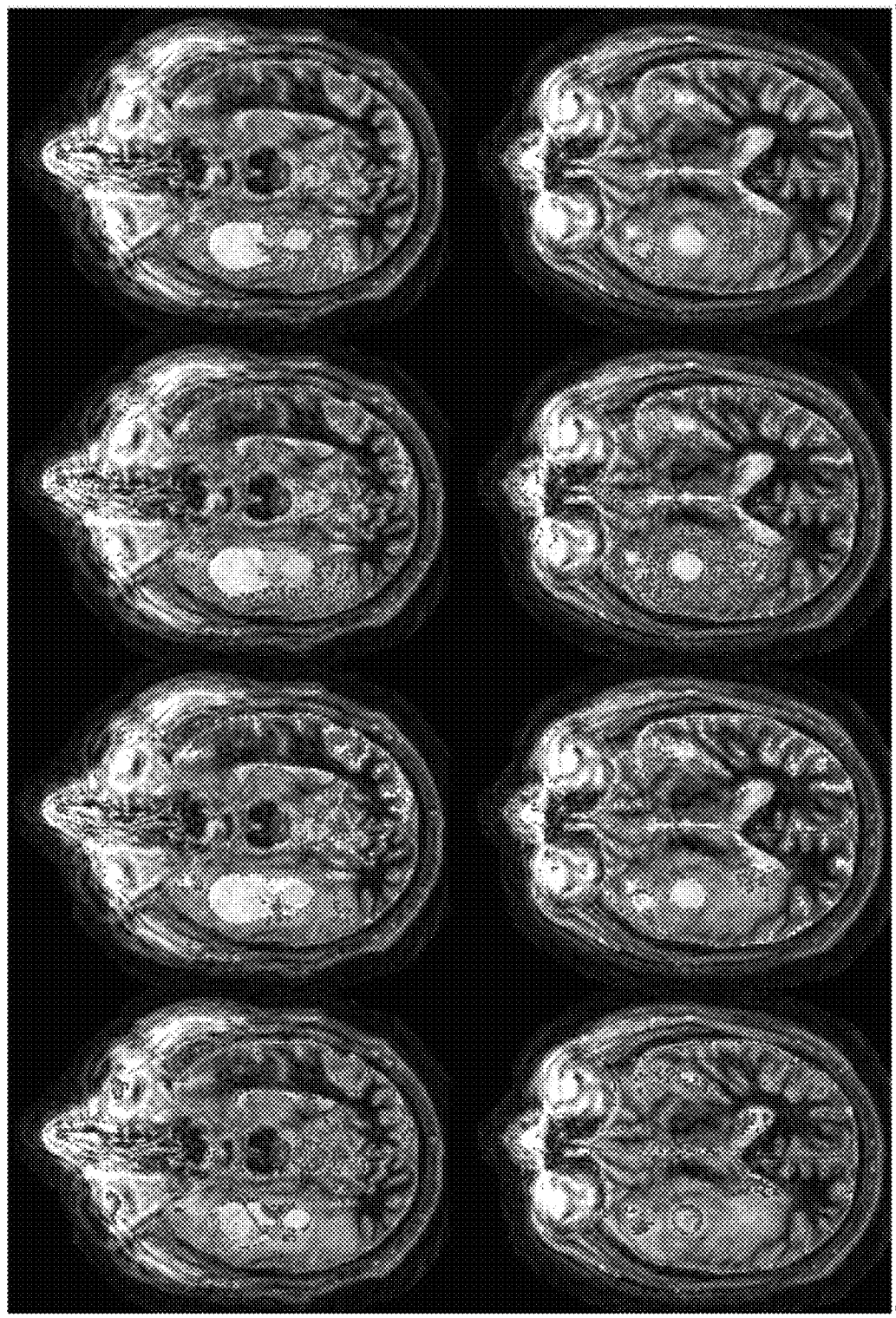
FIG. 4 is a series of images depicting non-limiting example components (columns) overlaid on two different slices (rows). ICA was applied to MRF data from a patient diagnosed with GBM. The leftmost component is the spatially distinct solid tumor, the other three components add up to the peri-tumoral white matter around the tumor.

Referring to FIG. 4, a series of images depicting non-limiting example components (columns) overlaid on two different slices (rows) is shown. In the present example, ICA was applied to MRF data from a patient diagnosed with glioblastoma (GBM). The leftmost component is the spatially distinct solid tumor, the other three components add up to the peri-tumoral white matter around the tumor.

Figure 5A:
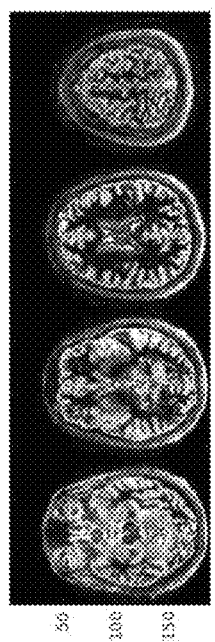
FIG. 5A is a series of image slices showing a non-limiting example of the independent component for CSF in ventricles for a subject.
Figure 5B:
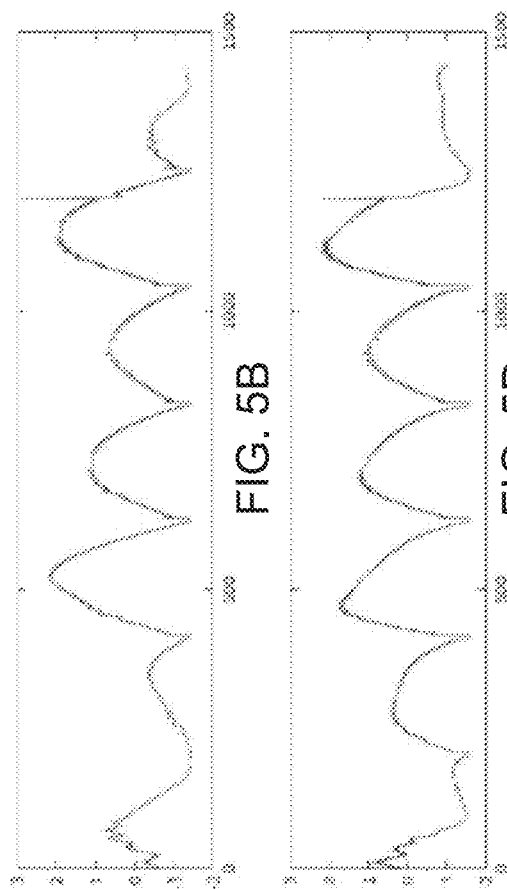
FIG. 5B is an example time course for FIG. 5A.
Figure 5C:
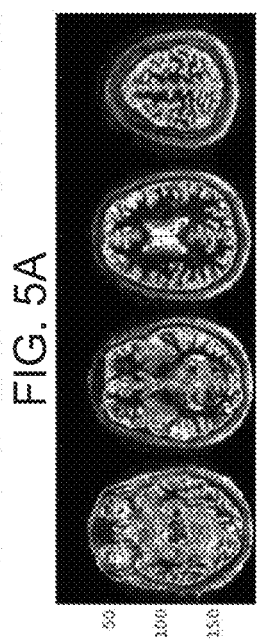
FIG. 5C is a series of image slices showing a non-limiting example of the independent component for CSF for a subject.
Figure 5D:
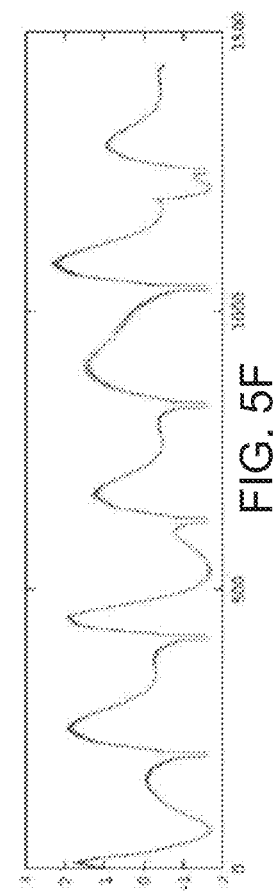
FIG. 5D is an example time course for FIG. 5C.
Figure 5E:
FIG. 5E is a series of image slices showing a non-limiting example of the independent component for white matter for a subject.
Figure 5F:
FIG. 5F is an example time course for FIG. 5E.
Figure 5G:
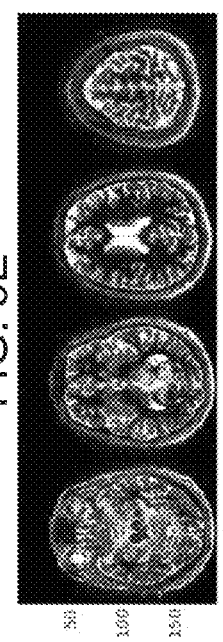
FIG. 5G is a series of image slices showing a non-limiting example of the independent component for gray matter for a subject.
Figure 5H:
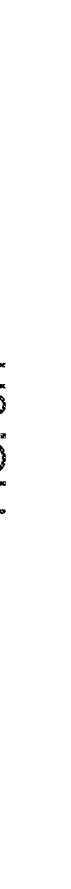
FIG. 5H is an example time course for FIG. 5G.

Referring to FIGS. 5A-H, non-limiting examples of anatomical segmentation achieved with ICA for a healthy subject is shown. FIG. 5A depicts a series of image slices showing the independent component for CSF in ventricles for the subject. FIG. 5B is an example time course for FIG. 5A. FIG. 5C is a series of image slices showing the independent component for CSF for the subject. FIG. 5D is an example time course for FIG. 5C. FIG. 5E is a series of image slices showing the independent component for white matter for the subject. FIG. 5F is an example time course for FIG. 5E. FIG. 5G is a series of image slices showing the independent component for gray matter for the subject. FIG. 5H is an example time course for FIG. 5G.

The present disclosure has described one or more preferred embodiments, and it should be appreciated that many equivalents, alternatives, variations, and modifications, aside from those expressly stated, are possible and within the scope of the invention.

The invention claimed is:

1. A method for distinguishing a tissue in a subject using magnetic resonance fingerprinting (MRF), comprising:
   acquiring MRF time course data sensitive to at least one signal source by exciting a plurality of resonant species simultaneously to make the tissue and at least one second tissue generate signal evolutions and collecting the generated signal evolutions for the tissue and the at least one second tissue simultaneously, using a magnetic resonance imaging system configured to vary acquisition parameters between repetition time periods;
   performing an independent component analysis (ICA) on the acquired MRF time course data with the collected signal evolutions to separate the signal evolutions of the tissue and the at least one second tissue; and
   generating a report based upon the ICA that distinguishes the tissue with the at least one signal source from the at least one second tissue.

2. The method of claim 1 wherein the MRF time course data are a MRF signal evolution monitored over a selected period of time.

3. The method of claim 1 further comprising using a low-rank reconstruction to generate the MRF time course data.

4. The method of claim 1 wherein the at least one signal source includes at least one of: composition, material, longitudinal relaxation time ($T_1$), transverse relaxation time ($T_2$), main magnetic field map ($B_0$), proton density (P), bias, artifact, or noise on MRF data.

5. The method of claim 1 wherein performing the ICA includes performing a blind source separation technique that is independent of a simulated MRF tissue dictionary.

6. The method of claim 1 wherein performing the ICA includes performing a probabilistic ICA technique.

7. The method of claim 1 wherein performing the ICA includes performing both a spatial and a temporal separation of the MRF time course data.

8. The method of claim 1 further comprising displaying the report as an image distinguishing the tissue based on the at least one signal source.

9. The method of claim 1 wherein the report quantifies a plurality of tissue properties.

10. The method of claim 1 further comprising selecting the signal source to be at least one tissue property of interest prior to acquiring the MRF time course data.

11. A system for distinguishing a tissue in a subject using magnetic resonance fingerprinting (MRF), comprising:
    a computer system configured to:
    i) acquire MRF time course data sensitive to at least one signal source by exciting a plurality of resonant species simultaneously to make the tissue and at least one second tissue generate signal evolutions and collecting the generated signal evolutions for the tissue and the at least one second tissue simultaneously, using a magnetic resonance imaging system configured to vary acquisition parameters between repetition time periods; and
    ii) perform an Independent Component Analysis (ICA) on the acquired time course data with the collected signal evolutions to separate the signal evolutions of the tissue and the at least one second tissue to distinguish the tissue in the subject from the at least one second tissue.

12. The system of claim 11 wherein the MRF time course data are a MRF signal evolution monitored over a period of time.

13. The system of claim 12 further comprising using a low rank reconstruction to generate the MRF time course data.

14. The system of claim 11 wherein the at least one signal source includes at least one of: composition, material, longitudinal relaxation time ($T_1$), transverse relaxation time ($T_2$), main or static magnetic field map ($B_0$), proton density (P), bias, artifact, or noise on MRF data.

15. The system of claim 11 wherein the ICA is a blind source separation technique that is independent of a simulated MRF tissue dictionary.

16. The system of claim 11 wherein performing the ICA includes performing a probabilistic ICA technique.

17. The method of claim 11 wherein performing the ICA includes performing both a spatial and a temporal separation of the MRF time course data.

18. The system of claim 11 further comprising generating a report for a user distinguishing the tissue.

19. The system of claim 11 further comprising distinguishing a plurality of tissues in the subject.

20. The system of claim 11 further comprising determining the signal source to be at least one tissue property of interest prior to acquiring the MRF time course data.

21. A method for distinguishing a tissue in a subject using magnetic resonance fingerprinting (MRF), comprising:
    a) selecting at least one tissue property of interest;
    b) acquiring MRF time course data sensitive to the at least one tissue property of interest by exciting a plurality of resonant species simultaneously to make the tissue and at least one second tissue generate signal evolutions and collecting the generated signal evolutions for the tissue and the at least one second tissue simultaneously, using a magnetic resonance imaging system configured to vary acquisition parameters between repetition time periods;
    c) performing an independent component analysis (ICA) on the MRF time course data with the collected signal evolutions to separate the signal evolutions of the tissue and the at least one second tissue; and
    d) generating a report based upon the ICA that distinguishes the tissue with the at least one tissue property of interest from the at least one second tissue.

22. The method of claim 21 wherein the MRF time course data are a MRF signal evolution monitored over a selected period of time.

23. The method of claim 21 further comprising using a low-rank reconstruction to generate the MRF time course data.

24. The method of claim 21 wherein the at least one tissue property of interest includes at least one of composition, material, longitudinal relaxation time ($T_1$), transverse relaxation time ($T_2$), main magnetic field map ($B_0$), or proton density (P).

25. The method of claim 21 wherein performing the ICA includes performing a blind source separation technique that is independent of a simulated MRF tissue dictionary.

26. The method of claim 21 wherein performing the ICA includes performing a probabilistic ICA technique.

27. The method of claim 21 wherein performing the ICA includes performing both a spatial and a temporal separation of the MRF time course data.

28. The method of claim 21 further comprising displaying the report as an image distinguishing the tissue based on the at least one tissue property of interest.

29. The method of claim 21 wherein the report quantifies a plurality of properties.

* * * * *